(12) United States Patent
Tanaka et al.

(10) Patent No.: US 8,742,395 B2
(45) Date of Patent: Jun. 3, 2014

(54) SEMICONDUCTOR LIGHT EMITTING DEVICE

(75) Inventors: Akira Tanaka, Kanagawa-ken (JP); Yoko Motojima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/598,367

(22) Filed: Aug. 29, 2012

(65) Prior Publication Data

US 2013/0181187 A1 Jul. 18, 2013

(30) Foreign Application Priority Data

Jan. 13, 2012 (JP) ................. P2012-004643
Feb. 29, 2012 (JP) ................. P2012-043100

(51) Int. Cl.
*H01L 33/06* (2010.01)

(52) U.S. Cl.
USPC .................. 257/13; 257/79; 257/E33.008

(58) Field of Classification Search
USPC ............ 257/13, 79–103, E33.008, E33.066, 257/E33.061, E33.025; 438/29, 285, 46, 438/483
See application file for complete search history.

(56) References Cited

U.S. PATENT DOCUMENTS

| 8,237,180 | B2 | 8/2012 | Iizuka et al. | |
| 2006/0261323 | A1 | 11/2006 | Suh et al. | |
| 2011/0204403 | A1* | 8/2011 | Kim et al. | 257/98 |
| 2011/0220932 | A1 | 9/2011 | Katsuno et al. | |
| 2012/0305954 | A1* | 12/2012 | Kim | 257/94 |
| 2013/0099265 | A1* | 4/2013 | Hwang | 257/98 |

FOREIGN PATENT DOCUMENTS

| JP | 2006324672 A | 11/2006 |
| JP | 4329166 B2 | 9/2009 |
| JP | 2009218495 A | 9/2009 |
| JP | 2009252860 A | 10/2009 |
| JP | 2010219502 A | 9/2010 |
| JP | 2010251531 A | 11/2010 |
| JP | 2011187873 A | 9/2011 |

* cited by examiner

*Primary Examiner* — Julio J Maldonado
*Assistant Examiner* — Whitney T Moore
(74) *Attorney, Agent, or Firm* — Patterson & Sheridan, LLP

(57) ABSTRACT

In one embodiment, a semiconductor light emitting device includes a stacked structure, a first electrode and a second electrode. A first semiconductor layer is broken into several pieces. Light is taken out from a light emitting layer side to a third semiconductor layer side. The first electrode includes a first region connected to the first semiconductor layer and a second region directly connected to the second semiconductor layer. The second electrode is connected to the third semiconductor layer, is provided above the second region from an upper direction of view, and has a thin wire shape or a dot shape.

10 Claims, 19 Drawing Sheets

SEMICONDUCTOR LIGHT EMITTING DEVICE

CROSS REFERENCE TO RELATED APPLICATION

This application is based upon and claims the benefit of priority from the prior Japanese Patent Application No. 2012-043100, filed on Feb. 29, 2012, and the prior Japanese Patent Application No. 2012-004643, filed on Jan. 13, 2012, the entire contents of which are incorporated herein by reference.

FIELD

Embodiments described herein relate to a semiconductor light emitting device.

BACKGROUND

In a semiconductor light emitting device, a high output power and high light emitting efficiency are required. To achieve a high output power, the semiconductor light emitting device having a structure in which an n-side electrode is provided at an upper portion, a p-side electrode combined with a reflection layer is provided at a lower portion, light is taken out from an upper side, has been developed.

In the semiconductor light emitting device with a thin wire structure, a hole injected to a light emitting layer is injected from the opposite direction versus a direction of an electron injection. Because a hole is heavier than an electron, a hole remains in a P-type semiconductor layer side. Because an electron is lighter than a hole, an electron reaches the P-type semiconductor layer. By a convergence of a hole and an electron, a recombination region easily generates below a thin wire electrode, a carrier concentration reaches a high concentration. In the semiconductor light emitting device with a high output power, when a carrier density increases in a narrow region, an overflow and non-radiative Auger recombination increase, therefore, a light emitting efficiency decreases.

DETAILED DESCRIPTION

Figure 1:
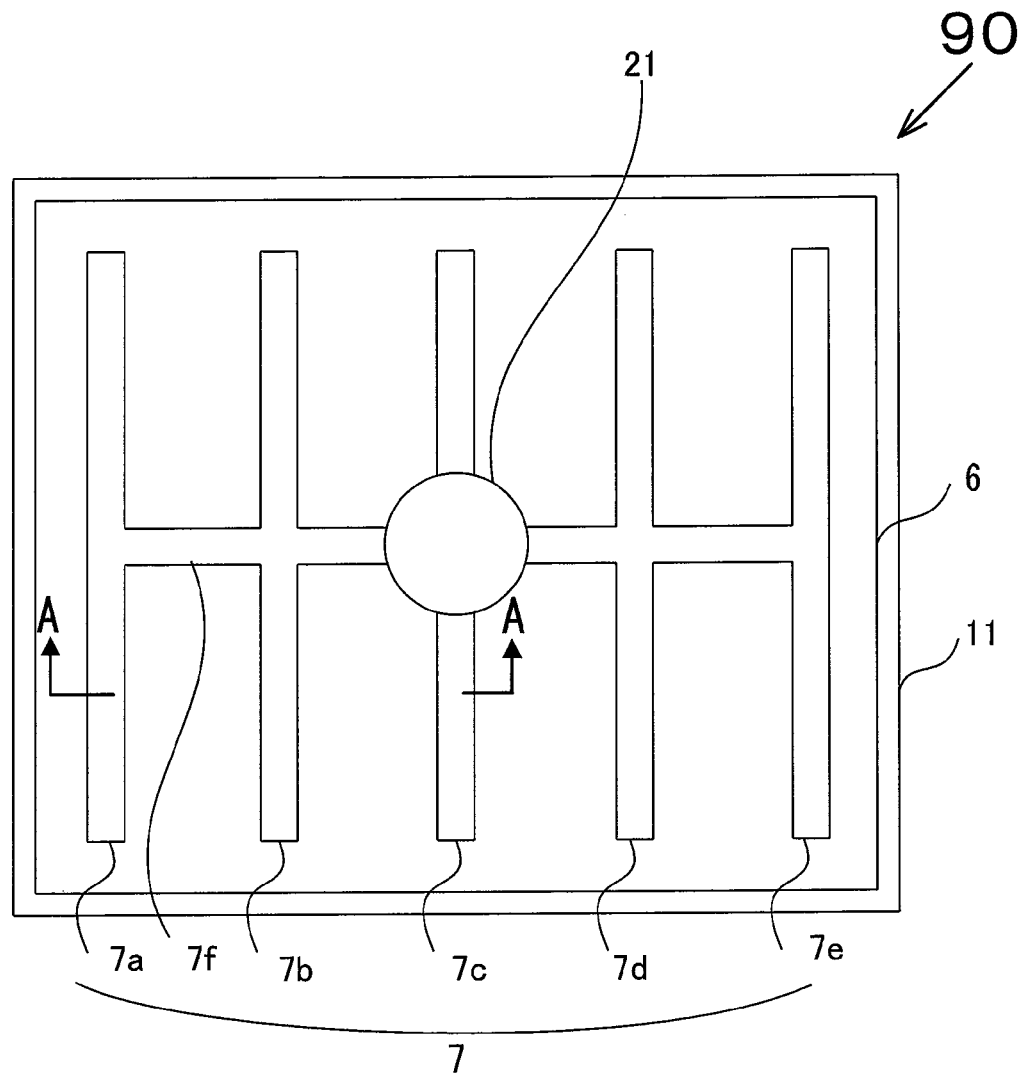
FIG. 1 is a schematic plan view showing a semiconductor light emitting device according to a first embodiment.

In one embodiment, a semiconductor light emitting device includes a stacked structure, a first electrode and a second electrode. The stacked structure includes a first semiconductor layer with a first conductivity type, a second semiconductor layer with a first conductivity type having an impurity concentration lower than the first semiconductor layer, a light emitting layer and a third semiconductor layer with a second conductivity type which are formed and stacked directly or indirectly. The first semiconductor layer is broken into several pieces. Light is taken out from the light emitting layer side to the third semiconductor layer side. The first electrode includes a first region connected to the first semiconductor layer and a second region directly connected to the second semiconductor layer. The second electrode is connected to the third semiconductor layer, is provided above the second region from an upper direction of view, and has a thin wire shape or a dot shape.

Hereinafter, further plural examples are described with reference to the drawings. In the drawings, the same numeral indicates the same or similar portions.

Figure 2:
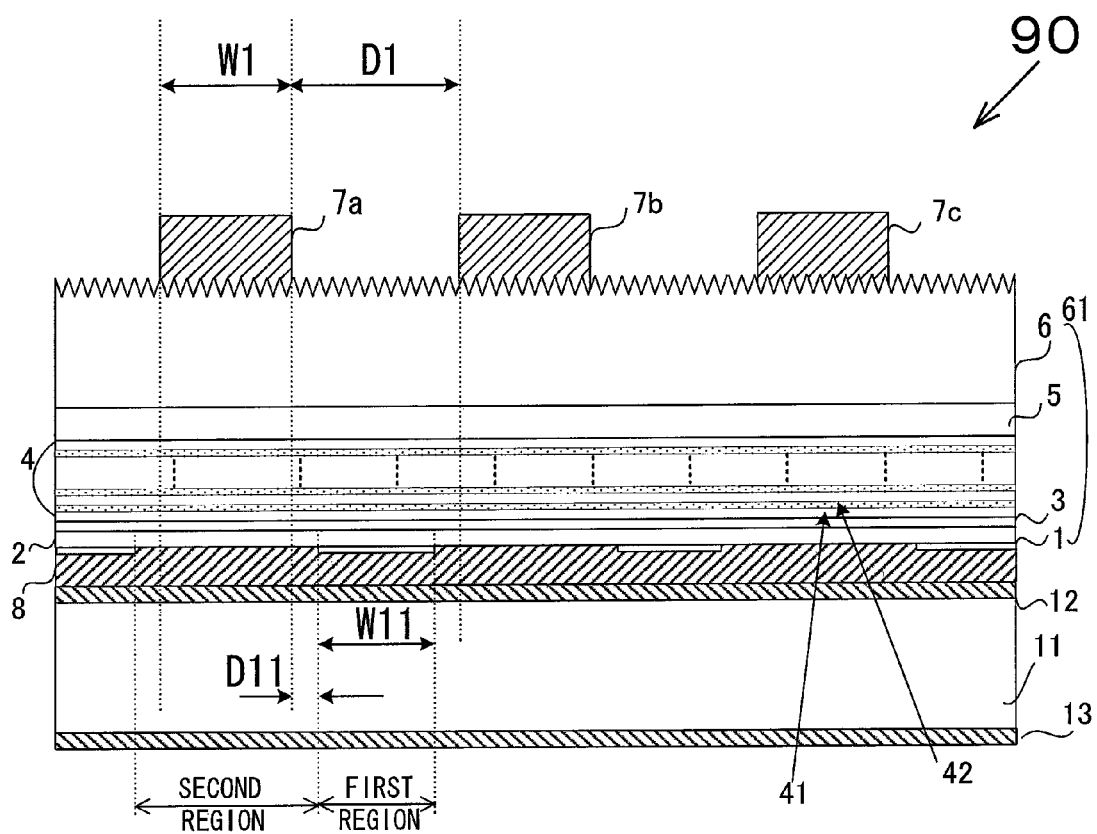
FIG. 2 is a schematic cross-sectional view of the semiconductor light emitting device taken along the A-A line of FIG. 1.

Descriptions will be provided for a semiconductor light emitting device of a first embodiment with reference to FIGS. 1, 2. FIG. 1 is a schematic plan view showing the semiconductor light emitting device. FIG. 2 is a schematic cross-sectional view of the semiconductor light emitting device taken along the A-A line of FIG. 1. In the embodiment, a P-type contact layer is provided below a portion between thin wire electrodes composed of an N-side electrode from an upper direction of view, an overflow and non-radiative Auger recombination at high current operation are suppressed. Therefore, it is possible to increase an optical output of the semiconductor light emitting device having a thin wire electrode structure.

As shown in FIG. 1, a semiconductor light emitting device 90 includes an N-type clad layer 6, an n-side electrode 7 and a supporting board 11. The semiconductor light emitting device 90 is a high output power GaN LED (light emitting diode) having an n-side thin wire electrode structure. The semiconductor light emitting device 90 is used for illumination, an automobile, a large display and the like.

The n-side electrode 7 has a thin wire electrode structure, and includes thin wire electrodes 7a-7f and a terminal electrode 21. Each of thin wire electrodes 7a-7f has a thin wire shape. Thin wire electrodes 7a-7e are provided in parallel away from each other in a vertical direction presented in FIG. 1. The thin wire electrode 7f is provided so as to bundle thin wire electrodes 7a-7e in horizontal direction presented in FIG. 1. The terminal electrode 21 has a circular shape, and is provided in a central portion of thin wire electrodes 7c, 7f. The terminal electrode 21 is connected to an outer terminal through a bonding wire (not illustrated).

As shown in FIG. 2, the semiconductor light emitting device 90 includes a lower substrate electrode 13, a supporting board 11, an upper substrate electrode 12, a p-side electrode 8, a stacked structure 61 and thin wire electrodes 7a-7c. In the semiconductor light emitting device 90, the p-side electrode 8, the stacked structure 61 and the thin wire electrodes 7a-7c is provided on the supporting board 11 through the upper substrate electrode 12. The lower substrate electrode 13 is provided on a backside of the supporting board 11.

In the semiconductor light emitting device 90, light generated in a MQW (multi quantum well) light emitting layer 4 of the stacked structure 61 is taken out from the N-type clad layer 6 side of the stacked structure 61. The p-side electrode 8 functions as a reflection layer which is reflected light generated in the MQW light emitting layer 4.

The stacked structure 61 is formed on the p-side electrode 8. The stacked structure 61 includes a P-type contact layer 1, a P-type clad layer 2, a P-type overflow suppressing layer 3, the MQW light emitting layer 4, a superlattice layer 5 and the N-type clad layer 6 which are formed and stacked using MOCVD (metal organic chemical vapor deposition), for example. The P-type overflow suppressing layer 3 operates so as to block a flow of an electron supplied from the n-side electrode 7 side.

The P-type contact layer 1 is broken into several pieces. A region in which the P-type contact layer 1 is not provided corresponds to a second region, the p-side electrode 8 is directly connected to the P-type clad layer 2 (Schottky contact). A region in which the P-type contact layer 1 is provided corresponds to a first region in which the p-side electrode 8 is connected to the P-type contact layer 1 (ohmic contact). A width of the first region is set to W11.

The thin wire electrodes 7a-7c are provided on the N-type clad layer 6. A width of the thin wire electrodes 7a-7c, respectively, is set to W1, the thin wire electrodes 7a-7c are provided away from a distance D1 each other. The thin wire electrodes 7a-7c are provided respectively above the second region from an upper direction of view. The thin wire electrodes 7a-7c and the P-type contact layer 1, respectively, are provided away from a distance D11. In other words, an edge of the second region is extended outward to the distance D11 compared to an edge of the thin wire electrodes 7a-7c.

The relationship of the distance D1, the distance D11, the width W1 and the width W11 is shown as follows, for example;

$$D1 > W11 > W1 > D11 \qquad \text{Expression (1)}$$

Here, the P-type contact layer 1 is a P$^+$-type GaN layer. The P-type contact layer 1 has an acceptor concentration with 1E21/cm$^3$, a film thickness of the P-type contact layer 1 is set to 5 nm, for example. The P-type clad layer 2 is a P-type GaN layer. The P-type clad layer 2 has an acceptor concentration with 1E20/cm$^3$, a film thickness of the P-type clad layer 2 is set to 100 nm, for example. The P-type overflow suppressing layer 3 is a P-type AlGaN layer. The P-type overflow suppressing layer 3 has an acceptor concentration with 1E20/cm$^3$, a film thickness of the P-type overflow suppressing layer 3 is set to 5 nm, for example.

The MQW light emitting layer 4 is an undoped MQW light emitting layer. The MQW light emitting layer 4 has a multiple quantum well structure, a well layer 42 and a barrier layer 41 differed from a composition of the well layer 42 are alternately-provided. The well layer 42 is an undoped InGaN, a thickness of the well layer 42 is set to 5 nm. The barrier layer 41 is an undoped GaN, a thickness of the barrier layer 41 is set to 5 nm, a number of the well layer 42 is set to four.

The superlattice layer 5 is an undoped superlattice layer with thirty quantum wells. The quantum well is composed of a well layer of an In$_{(L)}$Ga$_{(1-L)}$N layer with 1 nm thickness and a barrier layer of an In$_{(M)}$Ga$_{(1-M)}$N layer with 3 nm thickness for example, a value of L is differ from that of M.

The N-type clad layer 6 is an N-type GaN layer. The N-type clad layer 6 has a donor concentration with 1E19/cm$^3$, a film thickness of the N-type clad layer 6 is set to 4 μm, for example. A concavo-convex shape with, approximately, 1-2 μm depth is formed in a surface of the N-type clad layer 6.

The concavo-convex shape formed in a surface of the N-type clad layer 6 changes variously an optical incident angle entered in a surface side of the N-type clad layer 6. Therefore, a ratio of the light reflected totally at an interface between the N-type clad layer 6 and air decreases, it is enable to improve a light-extraction efficiency by formation of the concavo-convex shape.

The p-side electrode 8 is made of silver (Ag), however, gold (Au) may be used instead of silver (Ag). In the case where silver (Ag) is used, it is enable to improve a reflection ratio. In the case where gold (Au) is used, it is to enable to improve adhesion properties.

Here, a film thickness of the p-type contact layer 1, the P-type clad layer 2, the overflow suppressing layer 3, the MQW light emitting layer 4, the superlattice layer 5 and the N-type clad layer 6 is calculated by TEM (transmission electron microscope), X-ray diffraction and the like. An impurity concentration of the P-type contact layer 1, the P-type clad layer 2, the overflow suppressing layer 3, the MQW light emitting layer 4, the superlattice layer 5 and the N-type clad layer 6 is calculated by SIMS (secondary ion mass spectrometry) and the like.

Next, descriptions will be provided for a method for manufacturing a semiconductor light emitting device with reference to FIGS. 3 to 8. FIGS. 3 to 8 are cross-sectional views showing the respective steps for manufacturing the light emitting device.

Figure 3:
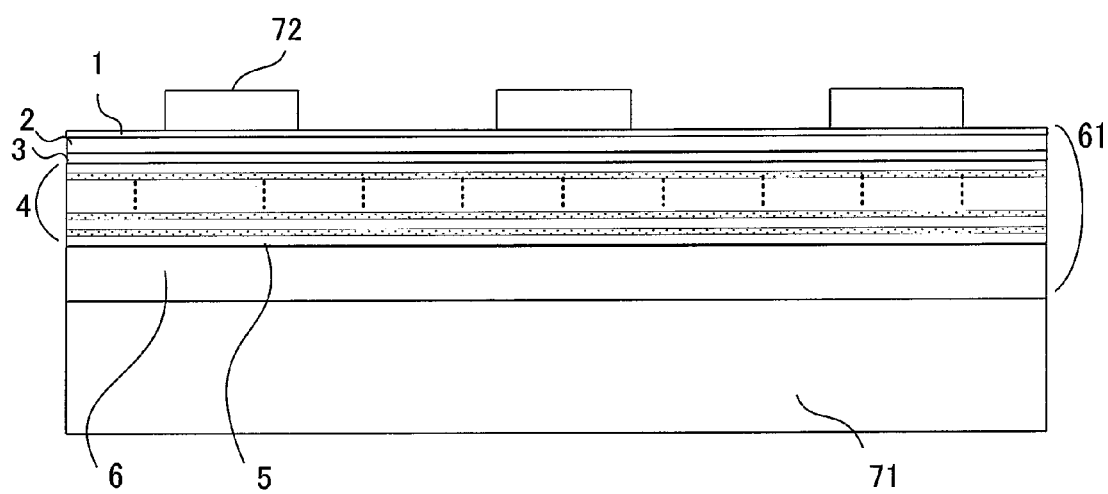
FIG. 3 is a cross-sectional view showing one of the steps for manufacturing the semiconductor light emitting device according to the first embodiment.

As shown in FIG. 3, a substrate 71 made of sapphire (Al$_2$O$_3$) is prepared, for example. The N-type clad layer 6, the superlattice layer 5, the MQW light emitting layer 4, the P-type overflow suppressing layer 3, the P-type clad layer 2 and the P-type contact layer 1, which are epitaxial layers whose compositions are different from one another, are consecutively formed and stacked on the first principal surface of the substrate 71 by MOCVD which is an epitaxial growth method. Here, the substrate 71 is made of sapphire ($Al_2O_3$), instead, however, may be made of silicon (Si). MBE (molecular beam epitaxy) may be used instead of MOCVD.

Next, a resist film 72 is formed on the P-type contact layer 1 using a well-known photolithographic method.

Figure 4:
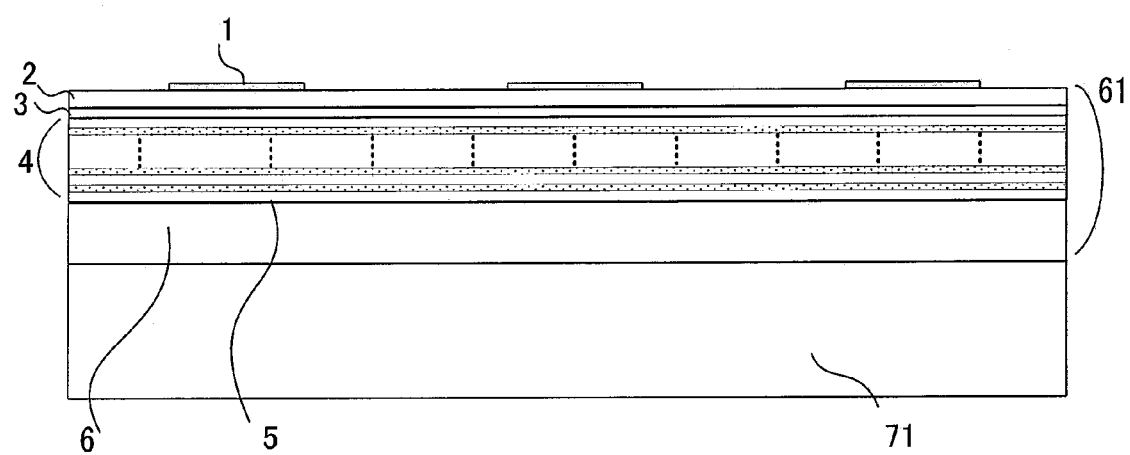
FIG. 4 is a cross-sectional view showing one of the steps for manufacturing the semiconductor light emitting device according to the first embodiment.

Subsequently, as shown in FIG. 4, the P-type contact layer 1 is etched by RIE (reactive ion etching) using the resist film 72 as a mask. After a removal of the resist film 72, an RIE post-treatment is performed. The P-type contact layer 1 may be etched using an etching solution instead of RIE. As a result, the first region connected to the p-side electrode 8 and the P-type contact layer 1 is formed, the second region directly connected to the p-side electrode 8 and the P-type clad layer 2 is formed.

Figure 5:
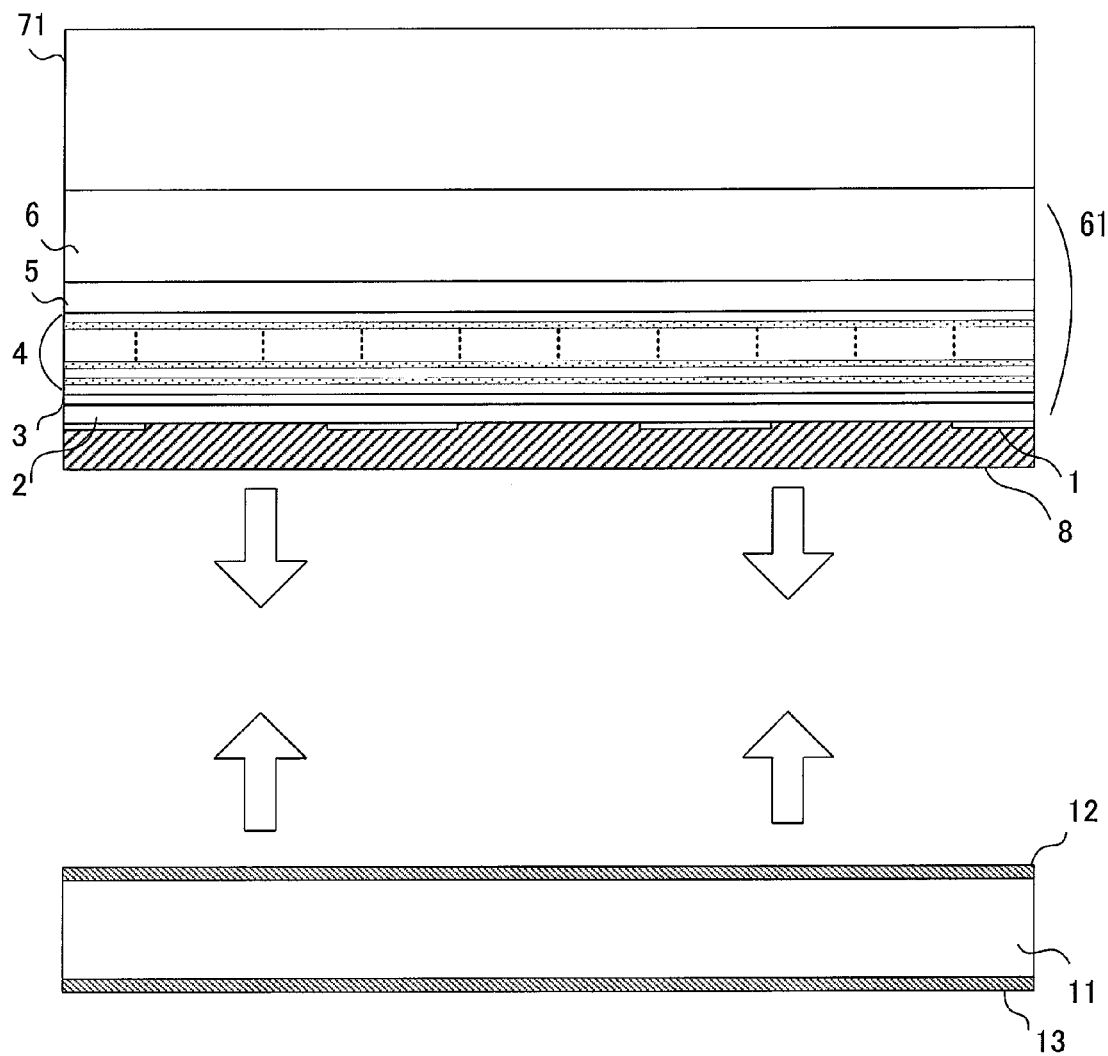
FIG. 5 is a cross-sectional view showing one of the steps for manufacturing the semiconductor light emitting device according to the first embodiment.

As shown in FIG. 5, the substrate 71 provided with the stacked structure 41 and the p-side electrode 8, and the supporting board 11 provided with the upper substrate electrode 12 and the lower substrate electrode 13 are bonded in such a manner that the p-side electrode 8 is opposite to the upper substrate electrode 12. After bonding, a surface of the p-side electrode 8 and a surface of the upper substrate electrode 12 are alloyed and bonded by thermal treatment. Here, the supporting board 11 is made of silicon (Si), for example.

An adhesive and the like are provided between the p-side electrode 8 and the upper substrate electrode 12, the p-side electrode 8 and the upper substrate electrode 12 may be bonded. In this case, it is enable to set a heating treatment temperature lower.

Figure 6:
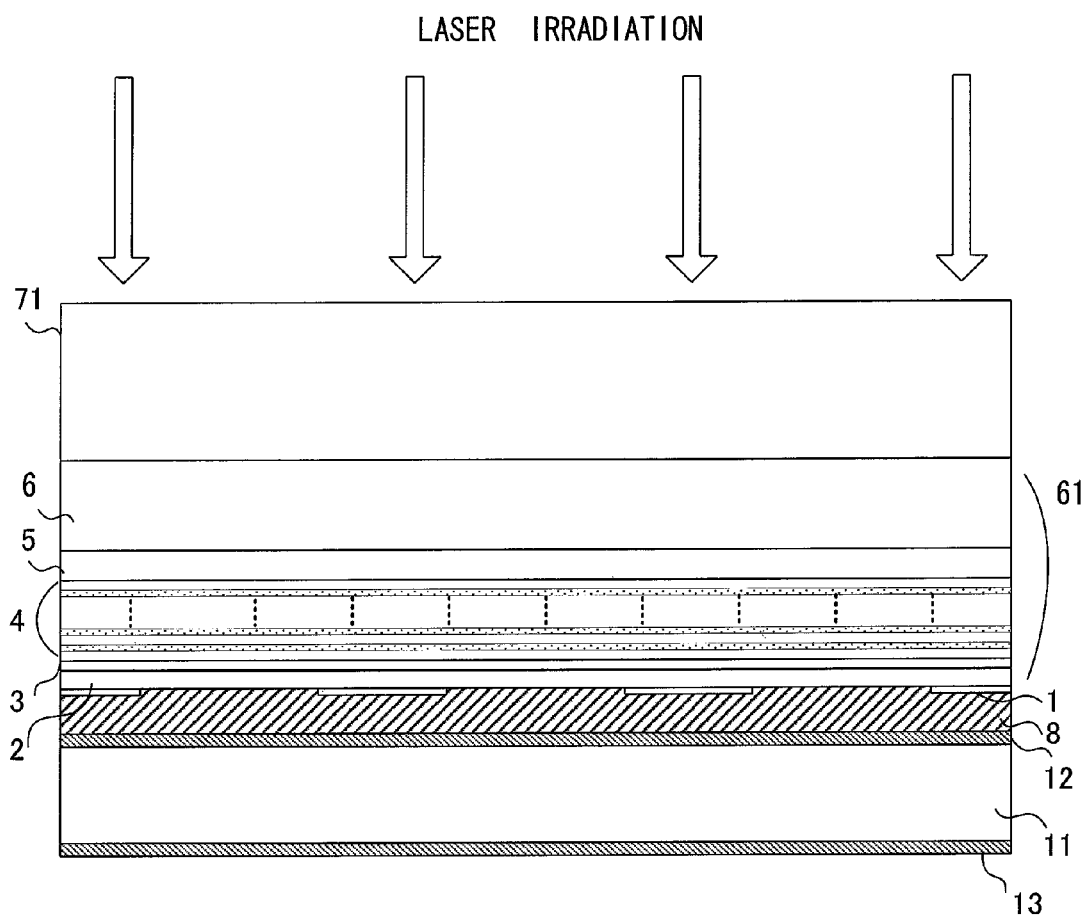
FIG. 6 is a cross-sectional view showing one of the steps for manufacturing the semiconductor light emitting device according to the first embodiment.

Next, as shown in FIG. 6, the substrate 71 is irradiated with a laser beam from the second principal surface side (a back surface in which the stacked structure 41 is not provided) opposed to the first principal surface side of the substrate 71. The laser beam is applied to laser liftoff for detaching the substrate 71 from the stacked structure 41 and the p-side electrode 8. A titanium-sapphire laser beam, for example, is used as the laser beam. Conditions employed for the laser beam include an 800-nanometer wavelength and a 100-femtosecond pulse width. A Nd-YAG laser beam may be used instead of the titanium-sapphire laser beam.

Because the substrate 71 made of sapphire ($Al_2O_3$) transmits the laser beam, a portion of the N-type clad layer 6 made of GaN, which is closer to the interface of the substrate 71, is decomposed into metallic Ga (gallium) and $N_2$ (nitrogen) by the laser beam. A portion of the substrate 71 made of sapphire ($Al_2O_3$), which is closer to the interface with the N-type clad layer 6, is melted by heat which is produced in conjunction with the decomposition as well. As a result, in the portion of the substrate 71 made of sapphire ($Al_2O_3$), an altered region is generated, and a detachment interface is formed.

Figure 7:
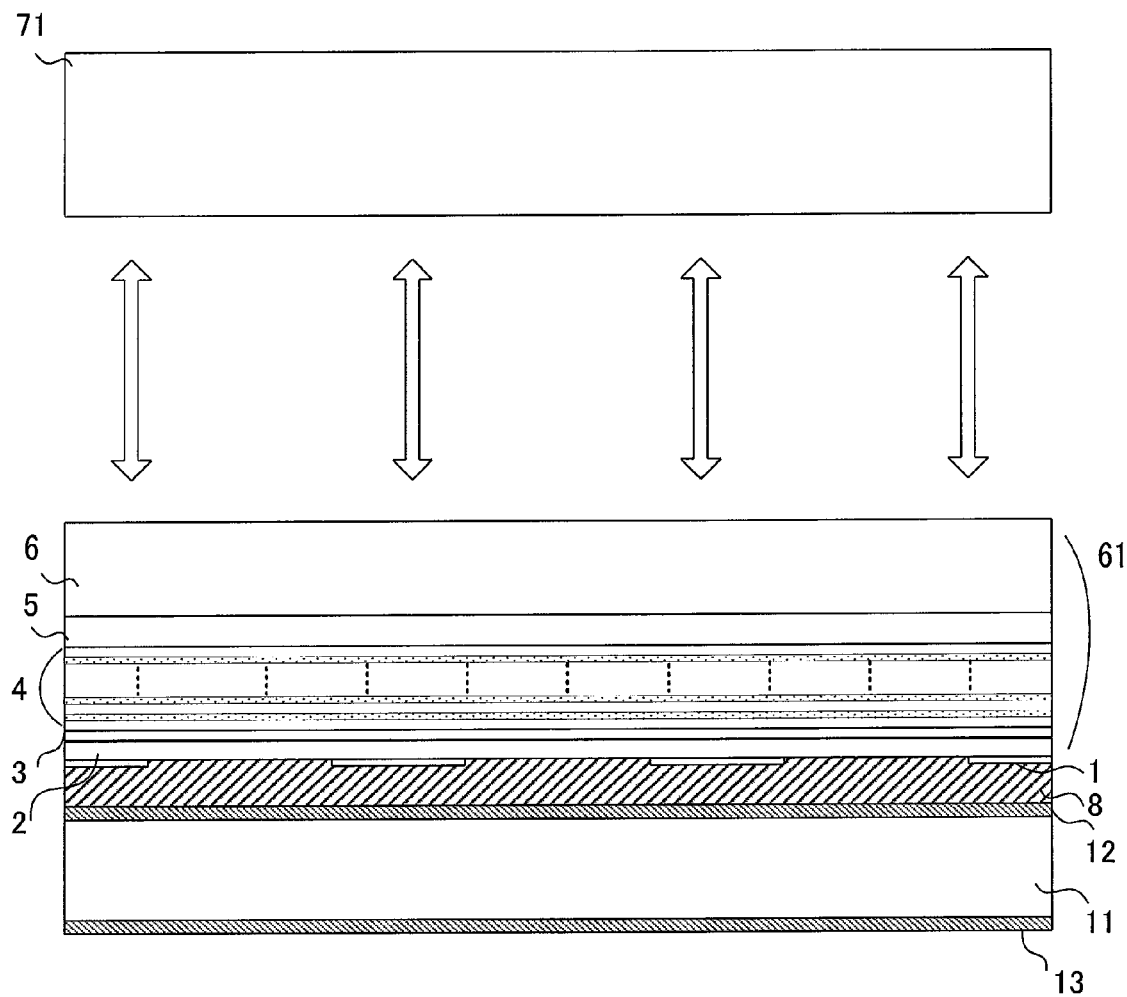
FIG. 7 is a cross-sectional view showing one of the steps for manufacturing the semiconductor light emitting device according to the first embodiment.

Subsequently, as shown in FIG. 7, the substrate 71 is detached from the p-side electrode 8 and the stacked structure 61 with the N-type clad layer 6 along the detachment interface by heating and cooling, for example. In this respect, the substrate 71 is detached by laser liftoff. Instead, however, the substrate 71 may be removed by etching.

Figure 8:
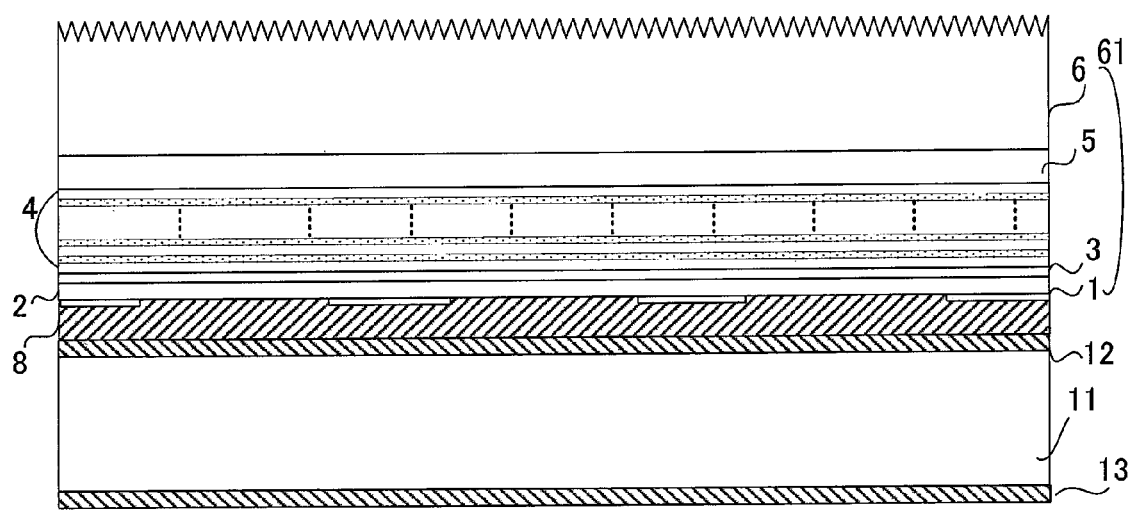
FIG. 8 is a cross-sectional view showing one of the steps for manufacturing the semiconductor light emitting device according to the first embodiment.

As shown in FIG. 8, a concavo-convex shape with, approximately, 1-2 µm depth is formed in a surface of the N-type clad layer 6 by etching a surface of the N-type clad layer 6. The concavo-convex shape is formed using a KOH solution, for example, however, may be formed using a patterning and RIE, or an imprint method and RIE.

After the formation of the concavo-convex shape in a surface of the N-type clad layer 6, the thin wire electrodes 7a-7c are formed on a surface of the N-type clad layer 6. Thereby, the semiconductor light emitting device 90 is completed.

Figure 9:
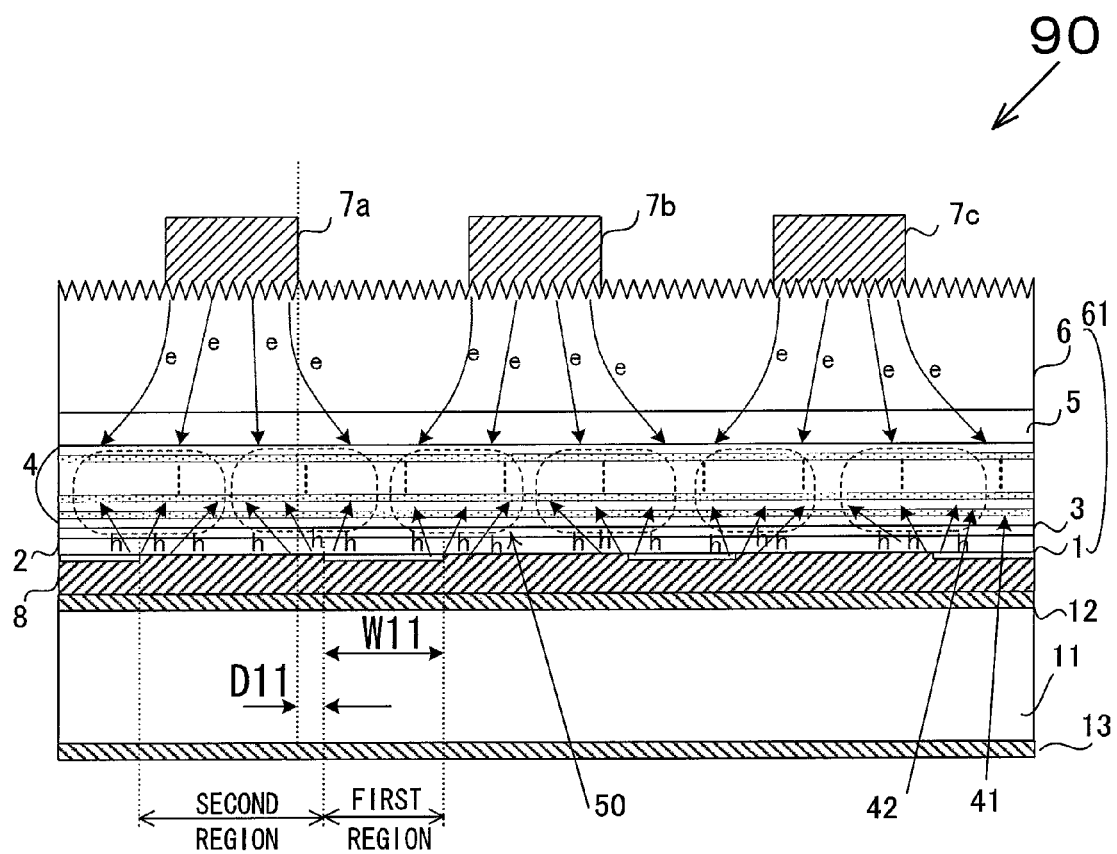
FIG. 9 is a view illustrating a behavior of an electron and a hole generated by the semiconductor light emitting device according to the first embodiment.
Figure 10:
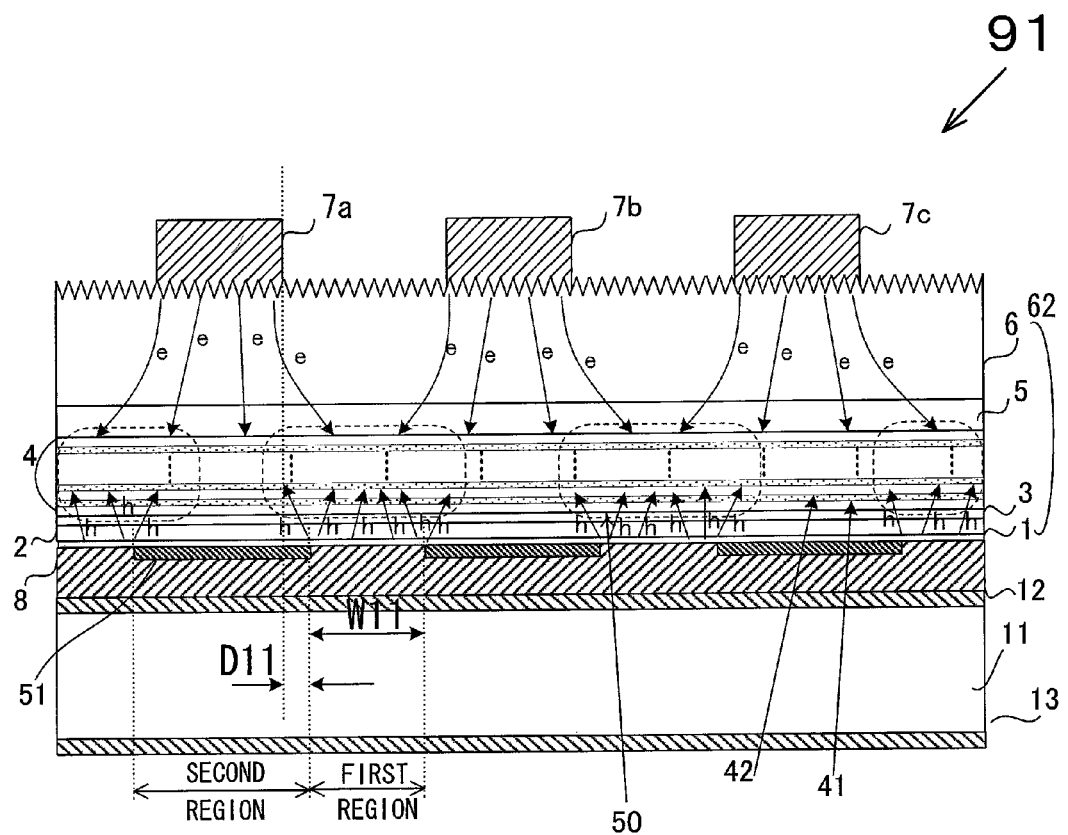
FIG. 10 is a view illustrating a behavior of an electron and a hole generated by a semiconductor light emitting device of a first comparative example according to the first embodiment.
Figure 11:
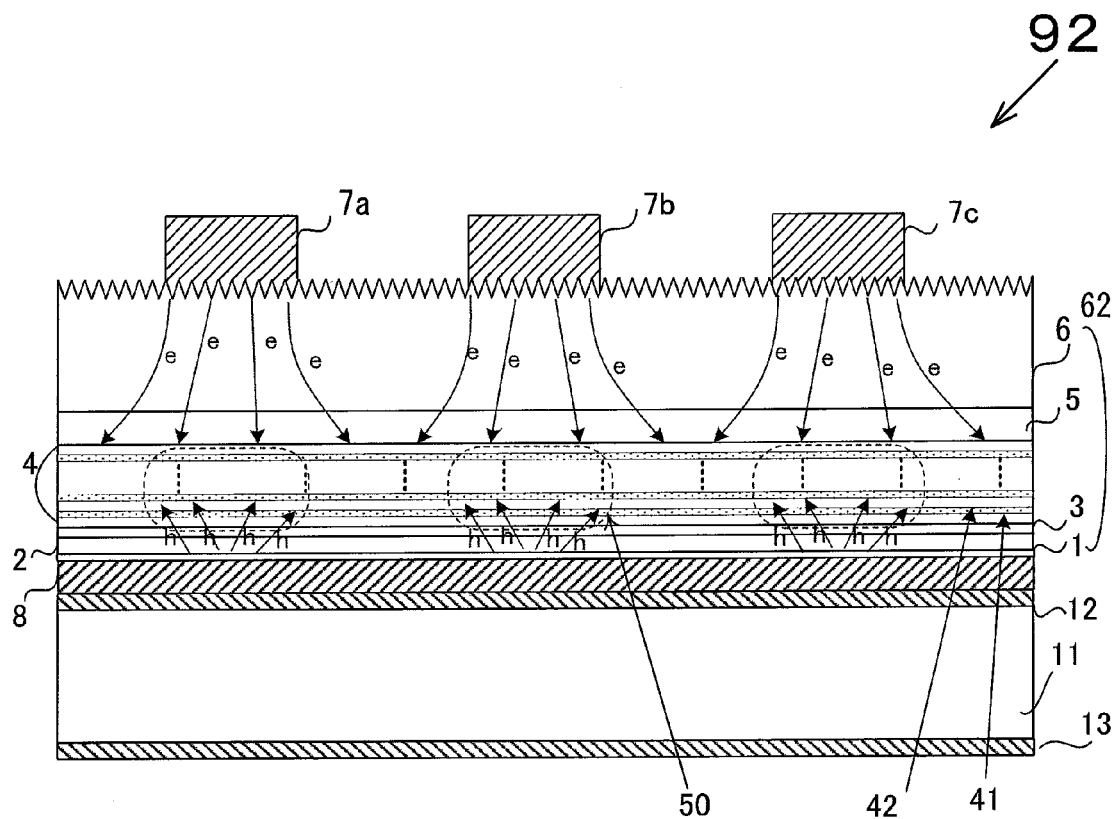
FIG. 11 is a view illustrating a behavior of an electron and a hole generated by a semiconductor light emitting device of a second comparative example according to the first embodiment.

Next, descriptions will be provided for a distribution of a recombination generation region in a semiconductor light emitting device having an n-side thin wire electrode with reference to FIGS. 9 to 11. FIG. 9 is a view illustrating a behavior of an electron and a hole generated by the semiconductor light emitting device of the embodiment. FIG. 10 is a view illustrating a behavior of an electron and a hole generated by a semiconductor light emitting device of a first comparative example. FIG. 11 is a view illustrating a behavior of an electron and a hole generated by a semiconductor light emitting device of a second comparative example.

As shown in FIG. 9, in the semiconductor light emitting device 90 of the embodiment, a hole generates from the P-type contact layer 1 of the first region toward an upper direction and an upper oblique direction when a voltage is applied between the p-side electrode 8 and the n-side electrode 7. Because a contact resistance increases in the second region, hole generation in the second region decreases compared with the first region. On the other hand, an electron generated in the thin wire electrodes 7a-7c side spreads not only a descent direction of the thin wire electrodes 7a-7c but also a side direction, and spreads totally at one side of the MQW light emitting layer 4.

As a result, a recombination generation region 50 is formed totally at one side of the MQW light emitting layer 4. Consequently, it is enable to average a carrier density of an active layer, and to suppress an increase of a carrier density in the active layer.

As shown in FIG. 10, in a semiconductor light emitting device 91 of a first comparative example, a dielectric layer 51 is provided in the second region between the p-side electrode 8 and the P-type contact layer 1. A stacked structure 62 differs from the stacked structure 61, and is provided with the P-type contact layer 1 so as to cover the p-side electrode 8 and the dielectric layer 51.

In the semiconductor light emitting device 91 of the first comparative example, a hole generates from the P-type contact layer 1 of the first region with the width W11 toward an upper direction and an upper oblique direction when a voltage is applied between the p-side electrode 8 and the n-side electrode 7. A hole does not generate in a middle region of the second region provided with a dielectric layer 51. On the other hand, an electron generated in the thin wire electrodes 7a-7c side spreads not only a descent direction of the thin wire electrodes 7a-7c but also a side direction, and spreads in the MQW light emitting layer 4. Consequently, in a middle region of the MQW light emitting layer 4 which is provided above the second region, the recombination generation region 50 dose not generate. For this reason, averaging of a carrier density in the active region in the semiconductor light emitting device 91 of the first comparative example decreases compared with that of the semiconductor light emitting device 90 of the embodiment. The dielectric layer 51 causes lowering of a reflection ratio and an optical output.

As show in FIG. 11, in a semiconductor light emitting device 92 of a second comparative example, the p-side electrode 8 is totally in contact with the P-type contact layer 1.

In the semiconductor light emitting device 92 of the second comparative example, a hole generates from the P-type contact layer 1 of the first region toward an upper direction and an upper oblique direction when a voltage is applied between the p-side electrode 8 and the n-side electrode 7. By a shielding effect of a thin wire electrode, it is possible to significantly suppress a hole which is generated from the P-type contact layer 1 located below the thin wire electrode. On the other hand, an electron generated in the thin wire electrodes 7a-7c side spreads not only a descent direction of the thin wire electrodes 7a-7c but also a side direction, and spreads in the MQW light emitting layer 4. As a result, the recombination generation region 50 is only generated below the thin wire electrode.

Figure 12:
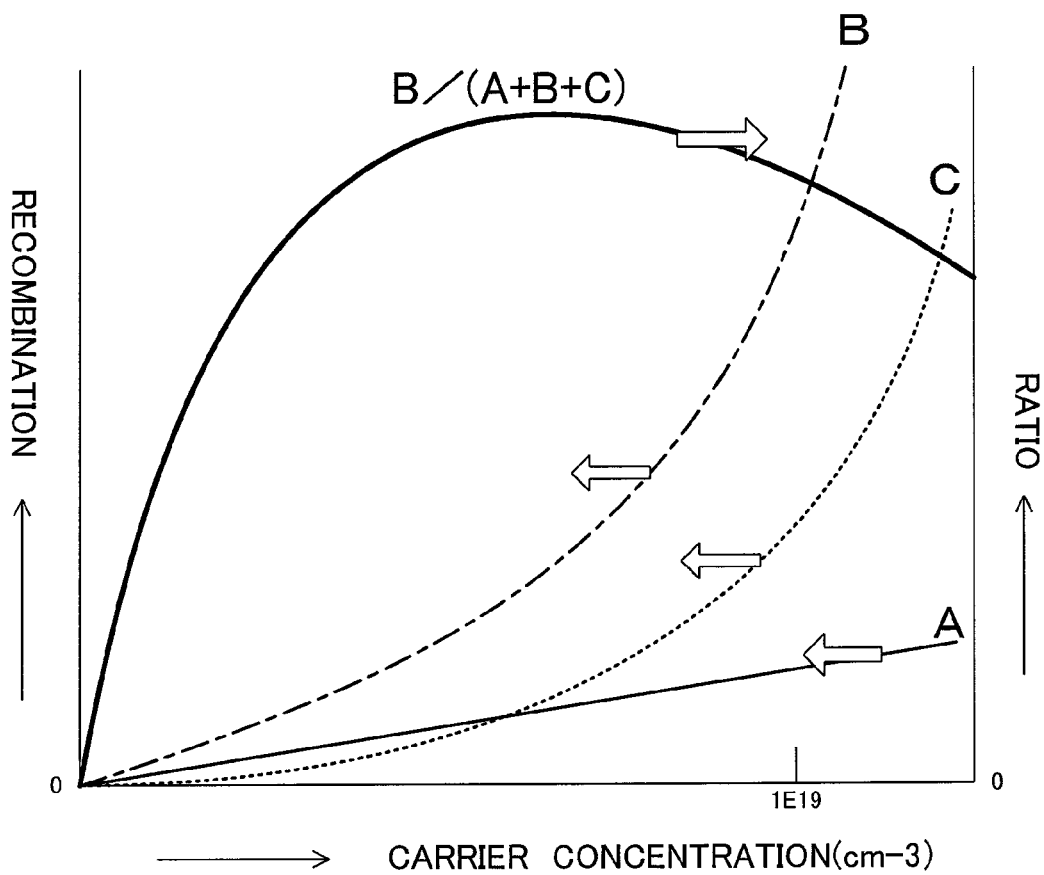
FIG. 12 is a view illustrating a relationship of a carrier concentration, recombination and a light emitting efficiency of the semiconductor light emitting device according to the first embodiment.

Here, descriptions will be provided for a carrier concentration, recombination and a light emitting efficiency of a semiconductor light emitting layer with reference to FIG. 12. FIG. 12 is a view illustrating a relationship of a carrier concentration, recombination and a light emitting efficiency of the semiconductor light emitting device.

As shown in FIG. 12, a non radiation A caused by SRH (Shockley-Read-Hall recombination) radiates energy as a vibration when an electron moves from a conduction band to a deep level, or moves from a deep level to a valence band. A binding fraction is proportional to a carrier.

A radiation B caused by a spontaneous emission is light generated when an electron moves from a valence band to a conduction band and then radiates energy. A binding fraction is proportional to the square of a carrier.

A non radiation C caused by non radiative Auger recombination radiates energy when an electron moves from a conduction band to a valence band, or excites when an electron catches energy in the conduction band. A binding fraction is proportional to the cube of a carrier.

The relationship of a ratio Y as a light emitting efficiency, the non radiation A, the radiation B and the non radiation C is shown as follows:

$$Y=B/(A+B+C) \qquad \text{Expression (2)}$$

The ratio Y as a light emitting efficiency increases with the increased amount of the carrier concentration. A value of the ratio Y is saturated when a carrier concentration reaches $4E18/cm^3$, for example, and decreases gradually when the carrier concentration increases more than $4E18/cm^3$.

In other words, in the case where a recombination generation region inhomogemeously generates, at a high current operation, recombination generates in a narrow region, a current concentrates, a carrier density increases. Therefore, an overflow and non radiative Auger recombination generate, a light emitting efficiency decreases.

Figure 13:
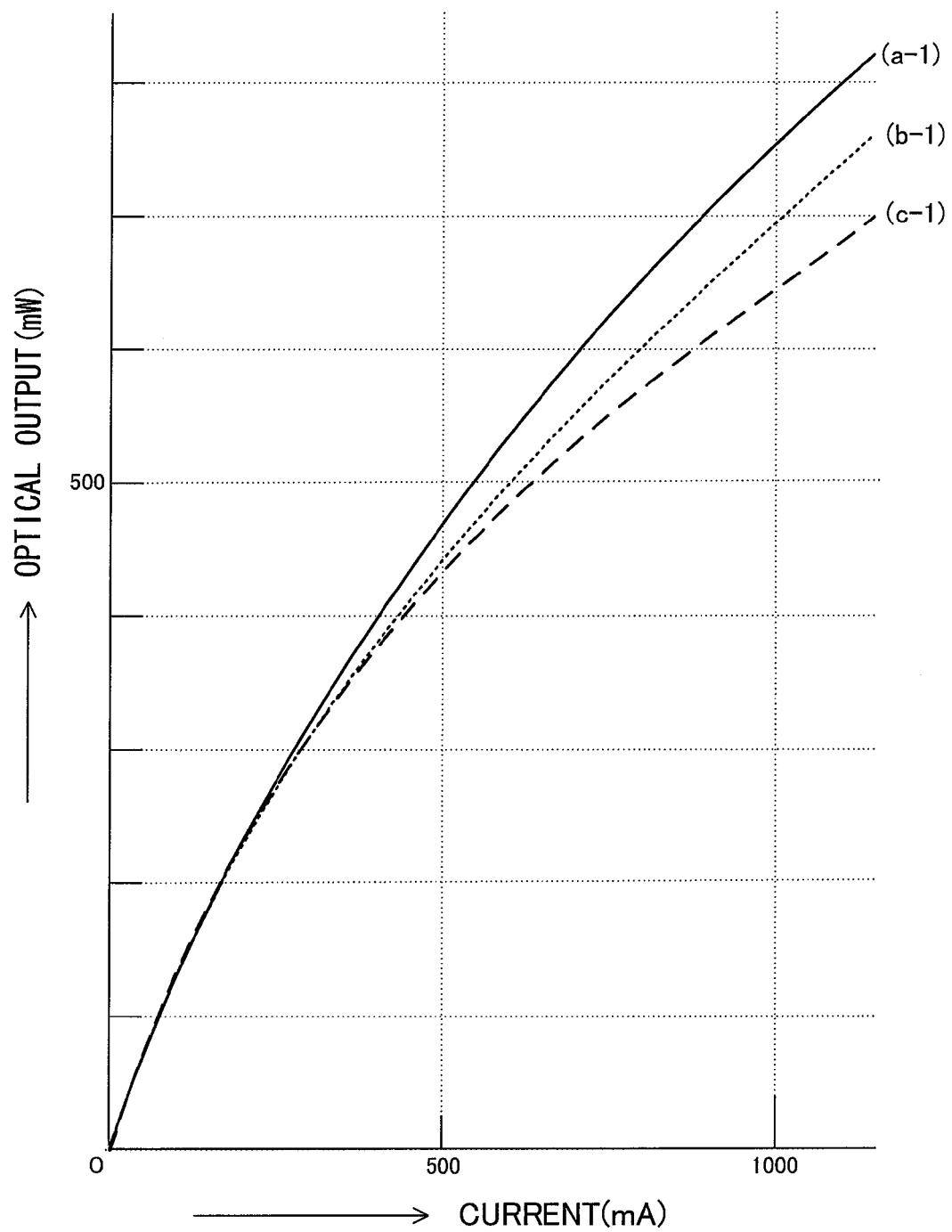
FIG. 13 is a view illustrating a relationship between a current and an optical output of the semiconductor light emitting device according to the first embodiment.

Next, descriptions will be provided for characteristics of a semiconductor light emitting device with reference to FIG. 13. FIG. 13 is a view illustrating a relationship between a current and an optical output of the semiconductor light emitting device. Here, a dashed line (c-1) shows characteristics of the semiconductor light emitting device 92 of the second comparative example. A dashed line (b-1) shows characteristics of the semiconductor light emitting device 91 of the first comparative example. A solid line (a-1) shows characteristics of the semiconductor light emitting device 90 of the embodiment.

As shown in FIG. 13, in the semiconductor light emitting device 92 of the second comparative example, the recombination generation region 50 only generates below the thin wire electrode. For this reason, an increase of an optical output is suppressed with increased amount of a current in comparison with the semiconductor light emitting device 91 of the first comparative example and the semiconductor light emitting device 90 of the embodiment.

In the semiconductor light emitting device 91 of the first comparative example, the recombination generation region 50 dose not generate in a middle portion of the MQW light emitting layer 4 which is provided above the second region. For this reason, an increase of an optical output is suppressed with increased amount of a current in comparison with the semiconductor light emitting device 90 of the embodiment.

In the semiconductor light emitting device 90 of the embodiment, the recombination generation region 50 is formed totally at one side of the MQW light emitting layer 4. For this reason, a carrier density of the active region is averaged. Consequently, a current concentration is relieved, it is enable to increase an optical output with increased amount of a current in comparison with the semiconductor light emitting device 91 of the first comparative example and the semiconductor light emitting device 92 of the second comparative example. An influence of shielding by the thin wire electrodes 7a-7c is considered. Homogenization of a carrier density contributes largely to an increase of a light emitting efficiency.

As described above, the semiconductor light emitting device of the embodiment includes the lower substrate electrode 13, the supporting board 11, the upper substrate electrode 12, the p-side electrode 8, the stacked structure 61 and the thin wire electrodes 7a-7c. The stacked structure 61 includes the P-type contact layer 1, the p-side clad layer 2, the P-type overflow suppressing layer 3, the MQW light emitting layer 4, the superlattice layer 5 and the N-type clad layer 6. The P-type contact layer 1 is broken into several pieces. A region in which the P-type contact layer 1 is not provided corresponds to the second region, the p-side electrode 8 is directly connected to the P-type clad layer 2. A region in which the P-type contact layer 1 is provided corresponds to the first region in which the p-side electrode 8 is connected to the P-type contact layer 1. The thin wire electrodes 7a-7c is provided on the N-type clad layer 6. A width of the thin wire electrodes 7a-7c, respectively, is set to W1, the thin wire electrodes 7a-7c are provided away from a distance D1 each other. The thin wire electrodes 7a-7c are provided respectively above the second region, from an upper direction of view. The thin wire electrodes 7a-7c and the P-type contact layer 1 are provided away from a distance D11 each other, from an upper direction of view.

Accordingly, when the semiconductor light emitting device 90 of the embodiment operates at a high-current, the recombination generates in wide region, it is possible to suppress to increase a carrier density of an active layer. Therefore, it is possible to suppress generation of the overflow and the non radiative Auger recombination, and to increase the optical output at high current.

Figure 14:
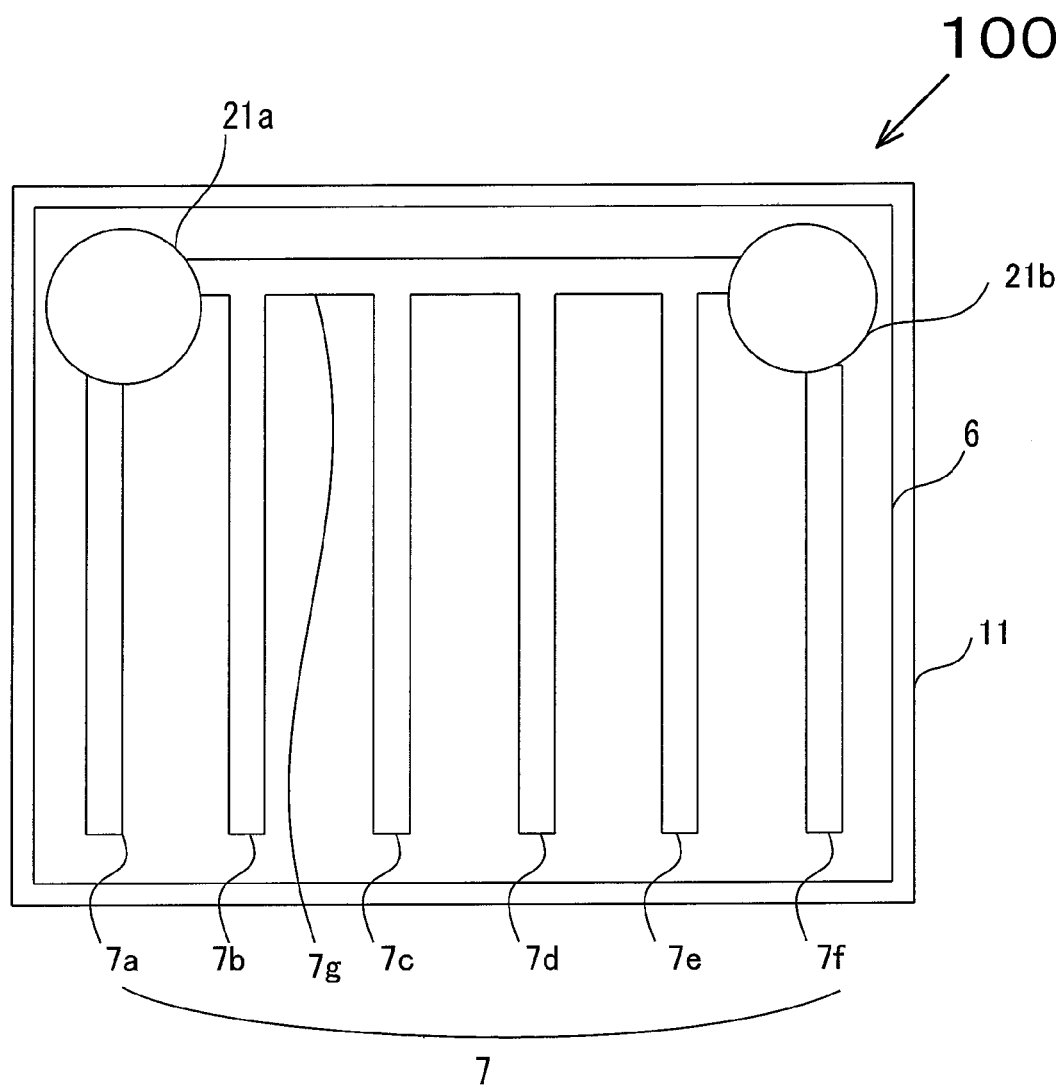
FIG. 14 is a schematic plan view showing the semiconductor light emitting device of the modification.

It should be noted that although a terminal electrode 12 is provided in the middle portion of the n-side electrode 7, the invention is not limited to the above case. A position of the terminal electrode may be changed such as a semiconductor light emitting device 100 of a comparative example as shown in FIG. 14, for example. Specifically, a terminal electrode 21a may be provided at upper left portion in the diagram, a terminal electrode 21b may be provided at upper right portion in the diagram.

Figure 15:
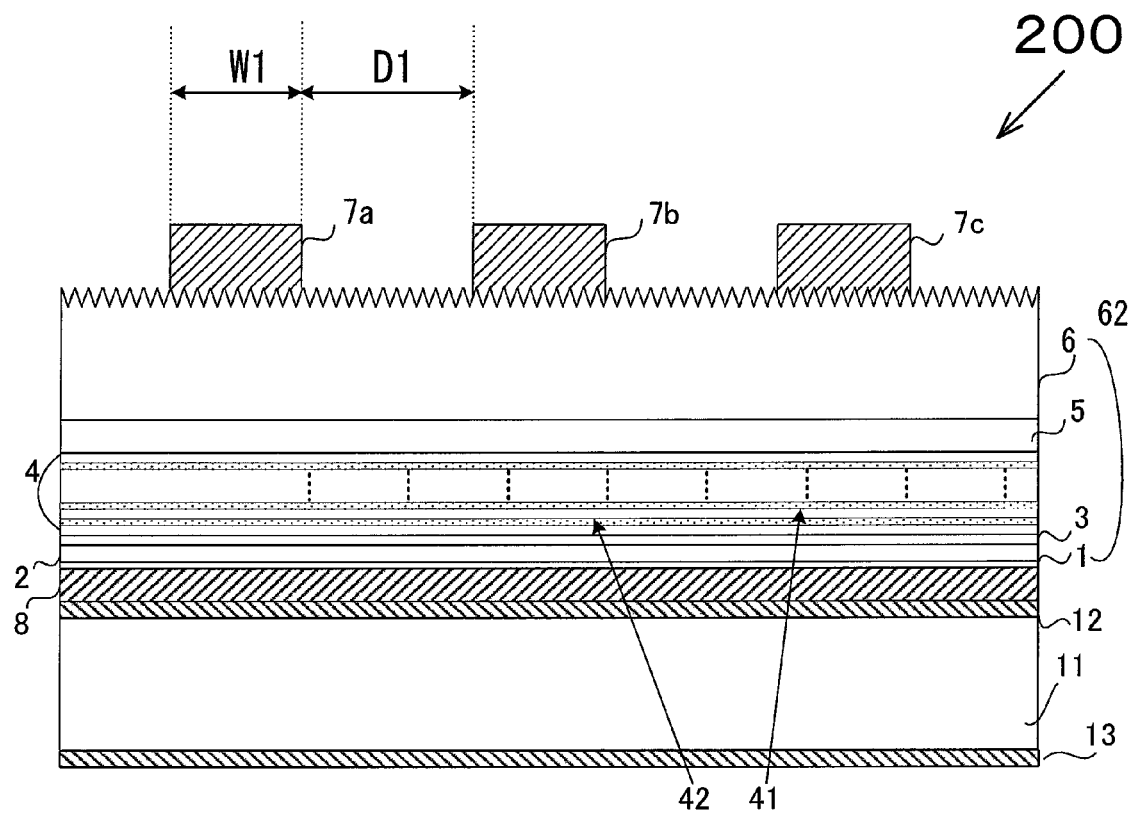
FIG. 15 is a cross-sectional view showing a semiconductor light emitting device according to a second embodiment.

Descriptions will be provided for a semiconductor light emitting device of a second embodiment with reference to FIG. 15. FIG. 15 is a cross-sectional view showing a semiconductor light emitting device. In the embodiment, a film thickness and a concentration of an N-type clad layer as an upper layer of a stacked structure are optimized, the overflow and the non radiative Auger recombination are suppressed at high current, therefore, it is enable to increase an optical output of a semiconductor light emitting device with a thin wire electrode structure.

Hereinafter, a portion with the same configuration in the first embodiment is provided with the same numeral, a description of the portion will not be repeated, and only a portion with a different configuration is described.

As shown in FIG. 15, a semiconductor light emitting device 200 includes the lower substrate electrode 13, the supporting board 11, the upper substrate electrode 12, the p-side electrode 8, the stacked structure 62 and the thin wire electrodes 7a-7c. In the semiconductor light emitting device 200, the p-side electrode 8, the stacked structure 62, and the thin wire electrodes 7a-7c are provided on the supporting board 11 through the upper substrate electrode 12. The lower substrate electrode 13 is provided on a backside of the supporting board 11. The semiconductor light emitting device 200 is a high output power GaN LED having an n-side thin wire electrode structure. The semiconductor light emitting device 200 is used for illumination and the like. A structure of the semiconductor light emitting device 200 is similar to that of the semiconductor light emitting device 92 of the second comparative example according to the first embodiment.

Figure 16A:
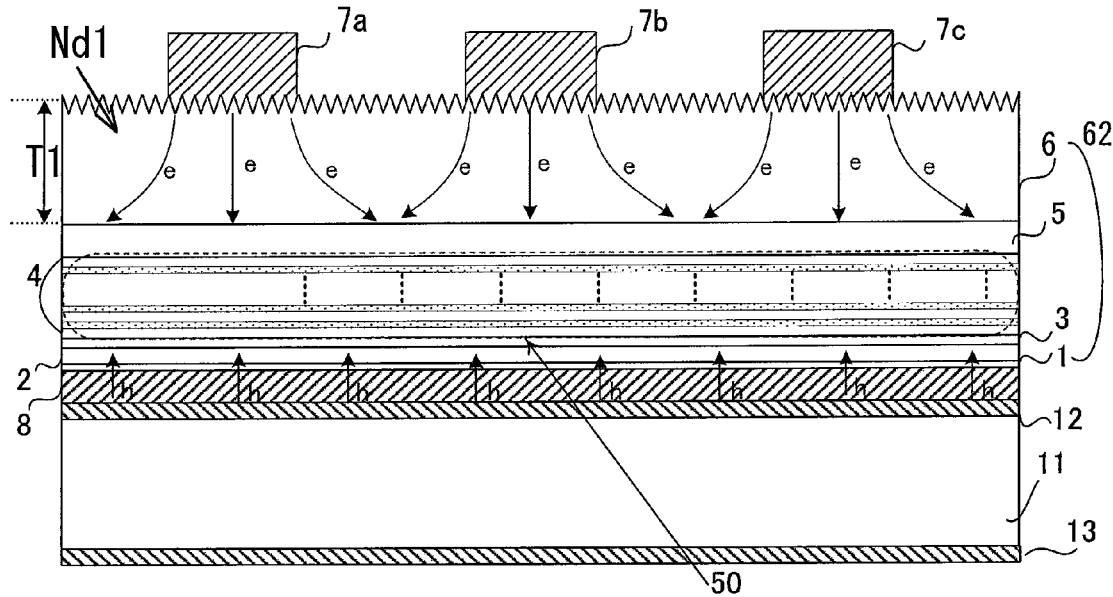
FIGS. 16a and 16b are views illustrating a behavior of an electron and a hole generated by the semiconductor light emitting device according to the second embodiment.
Figure 16B:
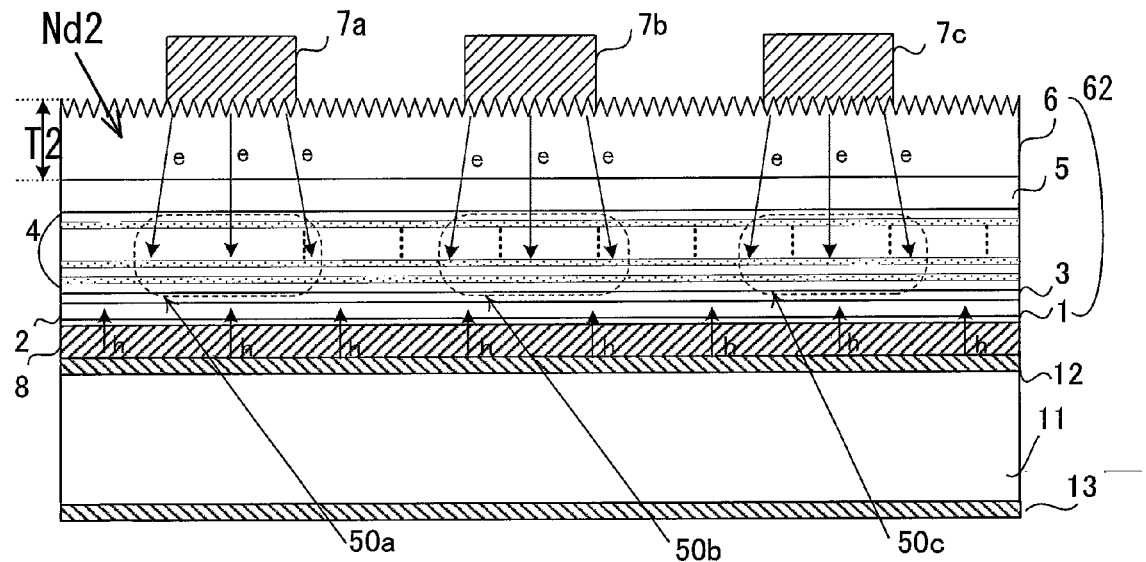

In the case of the high output power of the semiconductor light emitting device 200 with a thin wire structure, it is important to optimize a film thickness and an N-type impurity concentration of the N-type clad layer 6. As shown in the FIG. 16, in the semiconductor light emitting device 200 with an n-side thin wire electrode structure, distribution of a recombination generation region is profoundly affected by a formation condition of the N-type clad layer 6. FIGS. 16(a), 16(b) are a view illustrating a behavior of an electron and a hole generated by the semiconductor light emitting device.

As shown in FIG. 16(a), in the case where a film thickness of the N-type clad layer 6 is comparatively thickened, and an N-type impurity concentration of the N-type clad layer 6 is set comparatively a low concentration, when a voltage is applied between the p-side electrode 8 and the n-side electrode 7, a hole generates totally at one-side of the p-side electrode 8, and then a hole is supplied to the recombination generation region 50 which is formed totally at one-side of the MQW light emitting layer 4. On the other hand, an electron generated in the thin wire electrodes 7a-7c side spreads not only a descent direction of the thin wire electrodes 7a-7c but also a side direction, and then is supplied to the recombination generation region 50 which is formed totally at one side of the MQW light emitting layer 4. Consequently, it is enable to average a carrier density of an active layer, and to suppress an increase of a carrier density in the active layer.

As shown in FIG. 16(b), in the case where a film thickness of the N-type clad layer 6 is comparatively thinned, and an N-type impurity concentration of the N-type clad layer 6 is set comparatively a high concentration, when a voltage is applied between the p-side electrode 8 and the n-side electrode 7, a hole generates totally at one-side of the p-side electrode 8, and then a hole is supplied totally at one-side of the MQW light emitting layer 4. On the other hand, an electron generated in the thin wire electrodes 7a-7c side is supplied to the MQW light emitting layer 4 which is formed below the thin wire electrodes 7a-7c. Recombination generation regions 50a, 50b, 50c only generate below the thin wire electrodes 7a-7c, a recombination generation region does not generate between recombination generation regions 50a, 50b, 50c. Consequently, a carrier density of the active layer is eccentrically-located, the carrier density of the active layer increases in recombination generation regions 50a, 50b, 50c.

In other words, in the semiconductor light emitting device 200, in the case where a film thickness of the N-type clad layer 6 is comparatively thinned, and an N-type impurity concentration of the N-type clad layer 6 is set comparatively a high concentration, recombination generation regions inhomogeneously generate, and are isolated each other. Consequently, at high current operation, recombination generates in a narrow region, a current concentrates, therefore, a carrier density of the active layer increases. Because the overflow and the non radiative Auger recombination generate, the light emitting efficiency of the semiconductor light emitting device 200 decreases.

Figure 17:
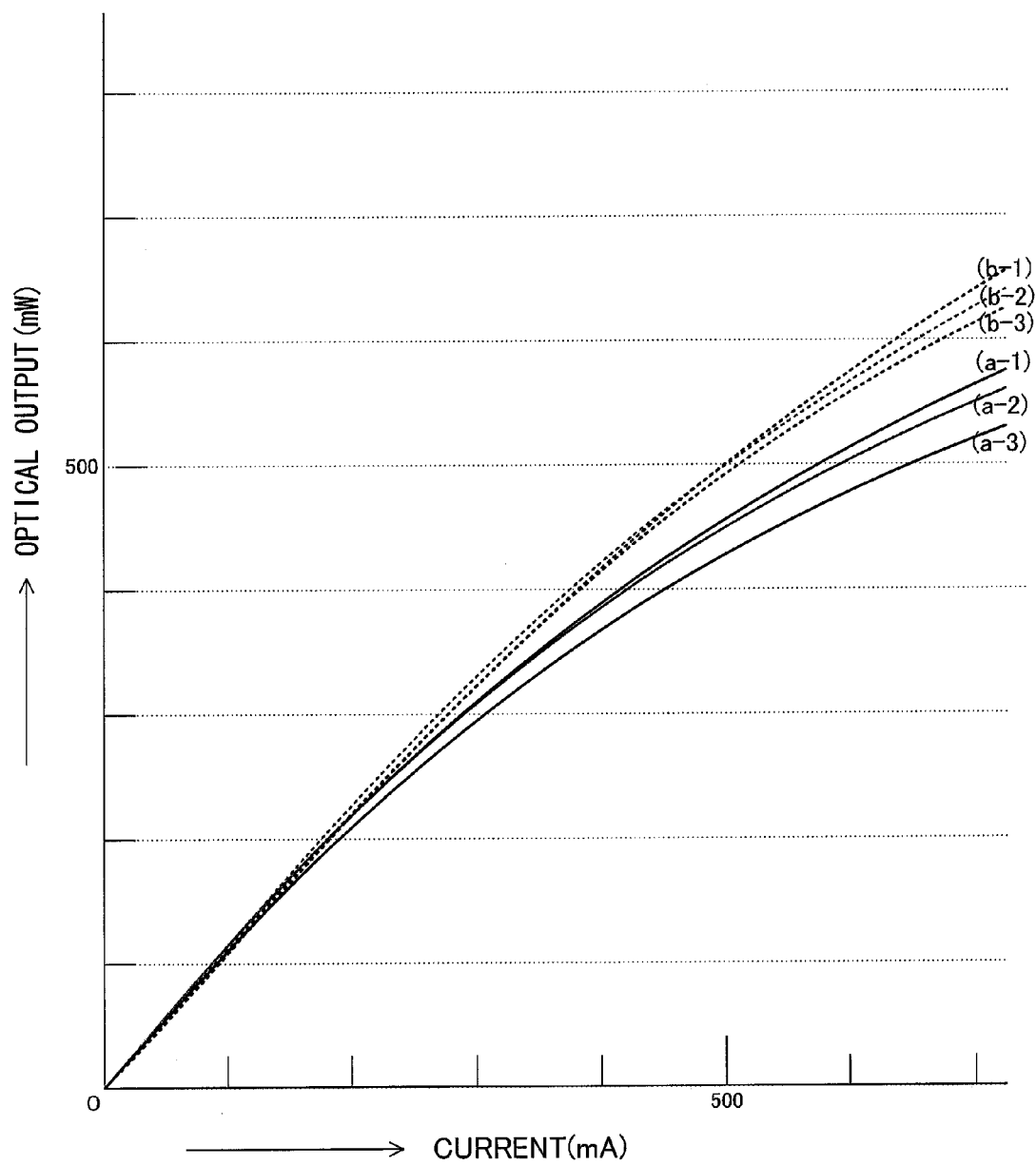
FIG. 17 is a view illustrating a relationship between a current and an optical output of the semiconductor light emitting device according to the second embodiment.
Figure 18:
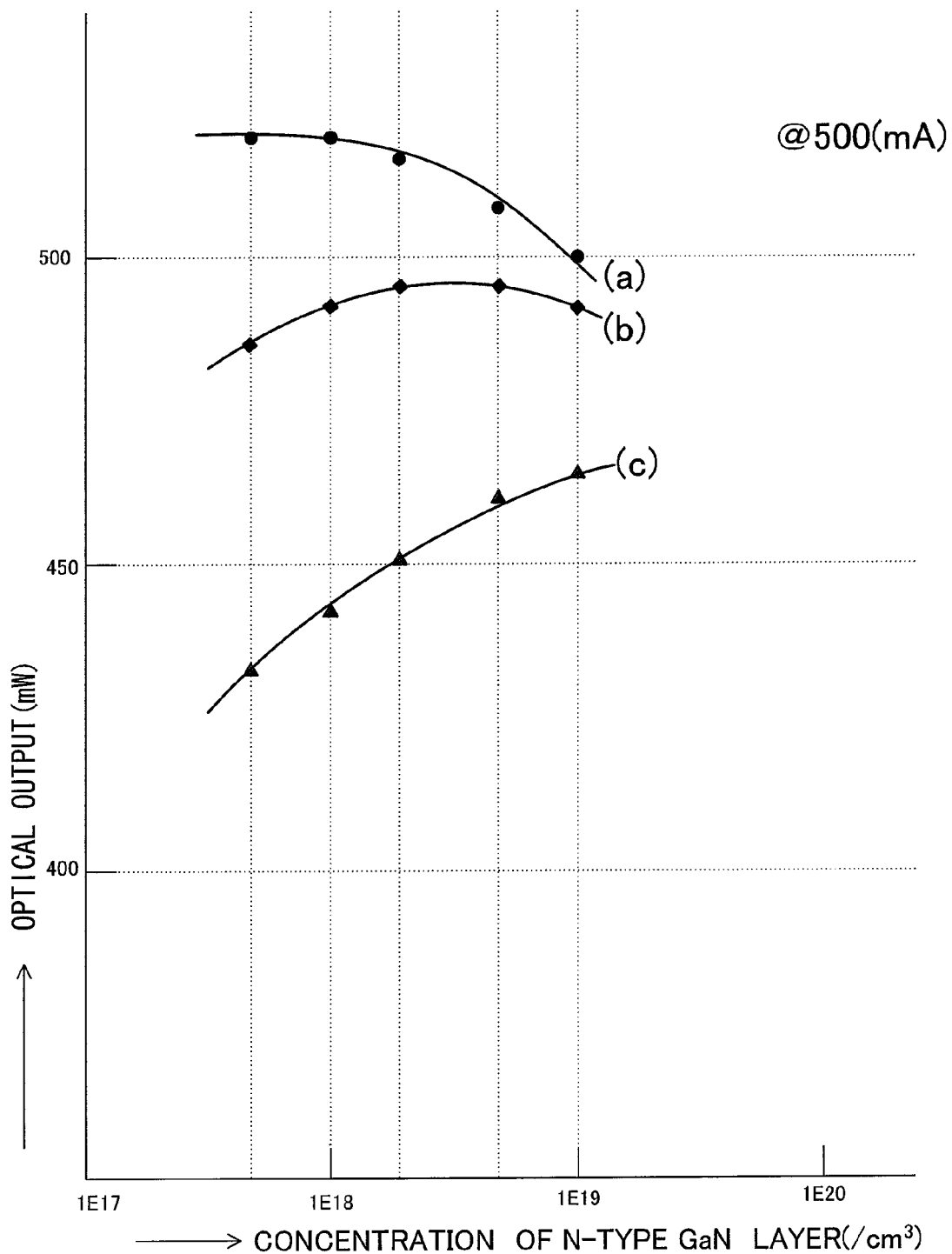
FIG. 18 is a view illustrating a relationship between a concentration of an N-type clad layer and an optical output of the semiconductor light emitting device according to the second embodiment.
Figure 19:
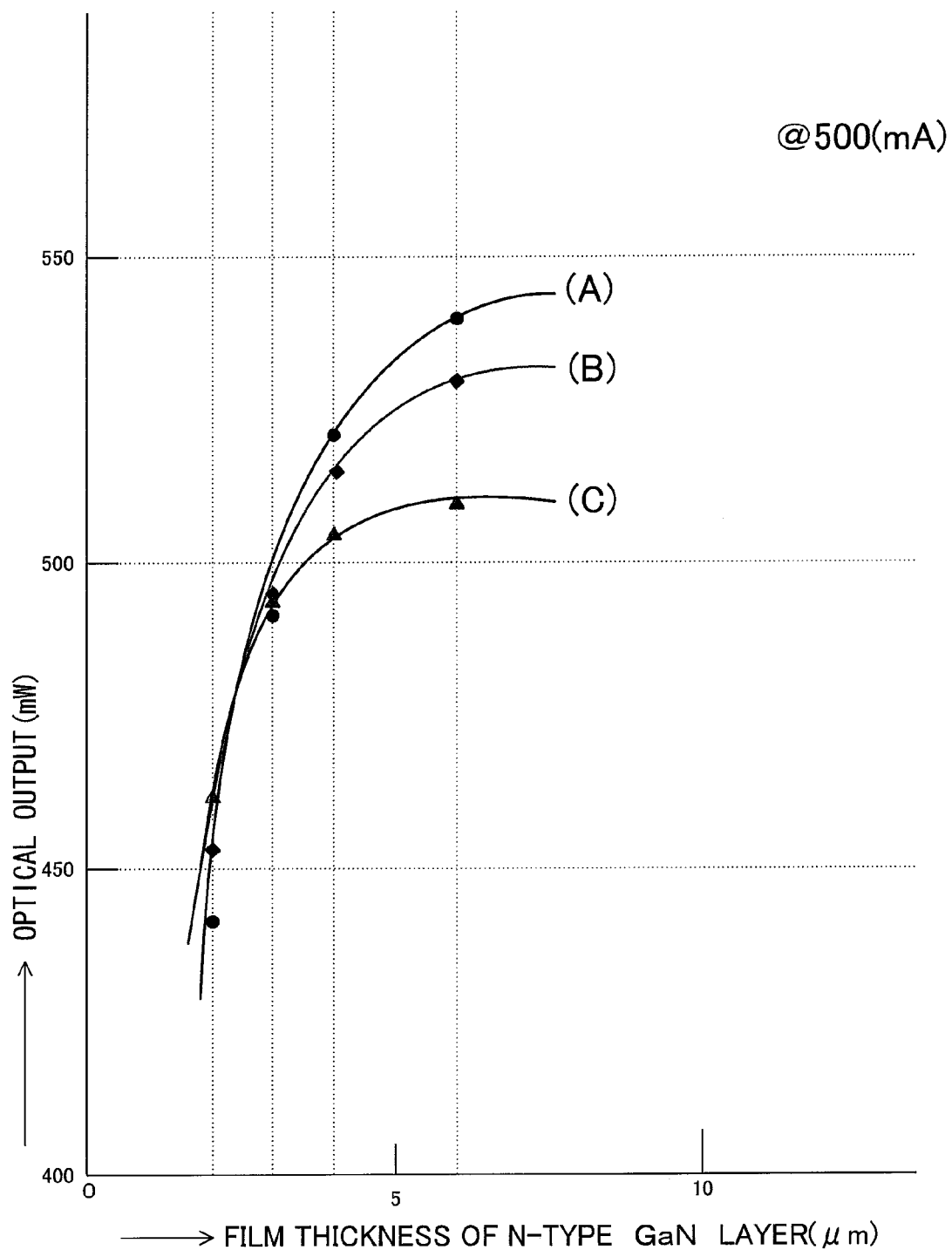
FIG. 19 is a view illustrating a relationship between a film thickness of an N-type clad layer and an optical output of the semiconductor light emitting device according to the second embodiment.

Next, descriptions will be provided for an appropriate formation condition against characteristics of a semiconductor light emitting device with reference to FIGS. 17-19. FIG. 17 is a view illustrating a relationship between a current and an optical output of the semiconductor light emitting device. FIG. 18 is a view illustrating a relationship between a concentration of an N-type clad layer and an optical output of the semiconductor light emitting device. FIG. 19 is a view illustrating a relationship between a film thickness of an N-type clad layer and an optical output of the semiconductor light emitting device.

Here, a film thickness of the p-type contact layer 1, the P-type clad layer 2, the overflow suppressing layer 3, the MQW light emitting layer 4, the superlattice layer 5 and the N-type clad layer 6 is calculated by TEM, X-ray diffraction and the like. An impurity concentration of the P-type contact layer 1, the P-type clad layer 2, the overflow suppressing layer 3, the MQW light emitting layer 4, the superlattice layer 5 and the N-type clad layer 6 is calculated by SIMS and the like.

As shown in FIG. 17, an optical output increases with increased amount of a current which is flowed in the semiconductor light emitting device 200. Here, a solid line (a-1), a solid line (a-2) and a solid line (a-3) show characteristics of the semiconductor light emitting device having the N-type clad layer 6 with 2 μm thickness. A dashed line (b-1), a dashed line (b-2) and a dashed line (b-3) show characteristics of the semiconductor light emitting device having the N-type clad layer 6 with 4 μm thickness. In the solid line (a-1) and the dashed line (b-1), an N-type impurity concentration of the N-type clad layer 6 is set to $1E18/cm^3$. In the solid line (a-2) and the dashed line (b-2), an N-type impurity concentration of the N-type clad layer 6 is set to $5E18/cm^3$. In the solid line (a-3) and the dashed line (b-3), an N-type impurity concentration of the N-type clad layer 6 is set to $1E19/cm^3$.

In the semiconductor light emitting device 200, it is enable to increase an optical output in a case of the N-type clad layer 6 with 4 μm thickness than that of the N-type clad layer 6 with 2 μm thickness. It is enable to increase an optical output in case of the N-type clad layer 6 having a lower N-type impurity concentration.

A solid line (a) shown in FIG. 18 shows characteristics of the semiconductor light emitting device having the N-type clad layer 6 with 4 μm thickness. A solid line (b) shows characteristics of the semiconductor light emitting device having the N-type clad layer 6 with 3 μm thickness. A solid line (c) shows characteristics of the semiconductor light emitting device having the N-type clad layer 6 with 2 μm thickness.

As shown in FIG. 18, in the semiconductor light emitting device 200, it is enable to increase an optical output in case of the N-type clad layer 6 with 4 μm thickness (the solid line (a)) in a comparison with other conditions (the solid line (b),(c)) (more than 500 mW). In the case where an N-type impurity concentration of the N-type clad layer 6 is set to be equal or below $2E18/cm^3$, it is enable to maintain a high optical power.

On the other hand, an optical output is low in case of the N-type clad layer 6 with 3 μm thickness (the solid line (b)) in a comparison with 4 μm thickness (the solid line (a)), an optical output is below 500 mW. An optical output is low in case of the N-type clad layer 6 with 2 μm thickness (the solid line (c)) in a comparison with 4 μm thickness (the solid line (a)), and is, furthermore, low in a comparison with 3 µm thickness (the solid line (b)), an optical output is below 460 mW.

A solid line (A) shown in FIG. 19 shows characteristics of the semiconductor light emitting device having an N-type impurity concentration of the N-type clad layer 6 with 1E18/cm³. A solid line (B) shows characteristics of the semiconductor light emitting device having an N-type impurity concentration of the N-type clad layer 6 with 2E18/cm³. A solid line (C) shows characteristics of the semiconductor light emitting device having an N-type impurity concentration of the N-type clad layer 6 with 5E18/cm³.

As show in FIG. 19, it is possible to increase an optical output in case of an N-type impurity concentration of the N-type clad layer 6 with 1E18/cm³ (the solid line (A)) and an N-type impurity concentration of the N-type clad layer 6 with 2E18/cm³ (the solid line (B)) in a comparison with an N-type impurity concentration of the N-type clad layer 6 with 5E18/cm³ (the solid line (C)). When a thickness of the N-type clad layer 6 is set to be equal to or above 4 µm, it is possible to increase an optical output.

By characteristics shown FIGS. 17-19, when a thickness of the N-type clad layer 6 is set to be equal to or above 4 µm, and an N-type impurity concentration of the N-type clad layer 6 is set to be equal to or below 2E18/cm³, the recombination generation region 50 is formed totally at one-side of the MQW light emitting layer 4, a carrier density is homogenized, it is enable to suppress an increase of a carrier density of an active layer. Consequently, it is possible to substantially suppress the overflow and the non radiative Auger recombination, and is possible to increase a light emitting efficiency.

As described above, the semiconductor light emitting device of the embodiment includes the lower substrate electrode 13, the supporting board 11, the upper substrate electrode 12, the p-side electrode 8, the stacked structure 62 and the thin wire electrodes 7a-7c. The stacked structure 62 includes the P-type contact layer 1, the p-side clad layer 2, the P-type overflow suppressing layer 3, the MQW light emitting layer 4, the superlattice layer 5 and the N-type clad layer 6. In the semiconductor light emitting device 200, light generated in the MQW light emitting layer 4 of the stacked structure 62 is taken out from the N-type clad layer 6 side. A concavo-convex shape is formed in a surface of the N-type clad layer 6, A thickness of the N-type clad layer 6 is set to be equal to or above 4 µm, and an N-type impurity concentration of the N-type clad layer 6 is set to be equal to or below 2E18/cm³.

Accordingly, when the semiconductor light emitting device 200 of the embodiment operates at a high-current, the recombination generates in wide region, it is possible to suppress to increase a carrier density of the active layer. Therefore, it is possible to suppress generation of the overflow and the non radiative Auger recombination, and to increase an optical output at high current.

In the embodiment, the thin wire electrode is used, however, an n-side electrode with a dot shape may be used instead of the thin wire electrode.

In the first embodiment, the stacked structure 61 includes the P-type contact layer 1 (a first semiconductor layer), the P-type clad layer 2, the P-type overflow suppressing layer 3, the MQW light emitting layer 4 (a light emitting layer), the superlattice layer 5 and the N-type clad layer 6 (a second semiconductor layer) are formed and stacked. It should be noted that although the P-type clad layer 2 and the P-type overflow suppressing layer 3 are provided between the P-type contact layer 1 (a first semiconductor layer) and the MQW light emitting layer 4 (a light emitting layer), the superlattice layer 5 is provided between the MQW light emitting layer 4 (a light emitting layer) and the N-type clad layer 6 (a second semiconductor layer), the invention is not limited to the above case. A stacked structure may include a P-type contact layer (a first semiconductor layer), a MQW light emitting layer and an N-type contact layer (a second semiconductor layer), for example. In this structure, it is enable to suppress generation of the overflow and the non radiative Auger recombination.

In the embodiment, the semiconductor light emitting device is used for a blue LED, however, may be used for a green LED, a red LED, a near-ultraviolet LED and the like.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
   a stacked structure including a first semiconductor layer with a first conductivity type, a second semiconductor layer with a first conductivity type, a light emitting layer and a third semiconductor layer with a second conductivity type which are formed and stacked directly or indirectly, the stacked structure taking out light from the light emitting layer side to the third semiconductor layer side, the first semiconductor layer being broken into several pieces, an impurity concentration of the second semiconductor layer being lower than that of the first semiconductor layer;
   a first electrode including a first region connected to the first semiconductor layer and a second region directly connected to the second semiconductor layer; and
   a second electrode connected to the third semiconductor layer and having a thin wire shape or a dot shape, the second electrode being provided above the second region from an upper side of view.

2. The semiconductor light emitting device according to claim 1, wherein the second region extends to an outer side in predetermined distance toward the second electrode from an upper side of view.

3. The semiconductor light emitting device according to claim 1, further comprising:
   an overflow suppressing layer with a first conductivity type provided between the second semiconductor layer and the light emitting layer; and
   a superlattice layer provided between the light emitting layer and the third semiconductor layer.

4. The semiconductor light emitting device according to claim 1, wherein the first semiconductor layer and the second semiconductor layer are a P-type GaN layer, the third semiconductor layer is an N-type GaN layer.

5. The semiconductor light emitting device according to claim 1, wherein the light emitting layer is a MQW light emitting layer in which a well layer composed of an undoped InGaN layer and a barrier layer composed of an undoped GaN layer are alternately-provided.

6. The semiconductor light emitting device according to claim 1, wherein the third semiconductor layer has a concave-convex shape which is provided in at least one portion of a surface of a third semiconductor layer.

7. The semiconductor light emitting device according to claim 1, wherein the first electrode combines with a reflection layer which reflects light generated from the light emitting layer.

8. The semiconductor light emitting device according to claim 1, wherein the first electrode is made of silver.

9. The semiconductor light emitting device according to claim 1, wherein the first electrode, the stacked structure and the second electrode are provided on a supporting board.

10. The semiconductor light emitting device according to claim 1, wherein the semiconductor light emitting device is used for any of a blue LED, a green LED, a red LED and a near-ultraviolet LED.

* * * * *